(12) United States Patent
Tamaoka et al.

(10) Patent No.: US 12,178,008 B2
(45) Date of Patent: Dec. 24, 2024

(54) COOLING APPARATUS AND COOLING SYSTEM

(71) Applicant: Nidec Corporation, Kyoto (JP)

(72) Inventors: Takehito Tamaoka, Kyoto (JP); Takahiro Imanishi, Kyoto (JP)

(73) Assignee: NIDEC CORPORATION, Kyoto (JP)

( * ) Notice: Subject to any disclaimer, the term of this patent is extended or adjusted under 35 U.S.C. 154(b) by 247 days.

(21) Appl. No.: 17/857,200

(22) Filed: Jul. 5, 2022

(65) Prior Publication Data

US 2023/0008735 A1    Jan. 12, 2023

(30) Foreign Application Priority Data

Jul. 7, 2021   (JP) .................... 2021-112668

(51) Int. Cl.
| | |
|---|---|
| H05K 7/00 | (2006.01) |
| H02K 5/22 | (2006.01) |
| H02K 11/33 | (2016.01) |
| H05K 7/20 | (2006.01) |

(52) U.S. Cl.
CPC ......... *H05K 7/20254* (2013.01); *H02K 5/225* (2013.01); *H02K 11/33* (2016.01); *H05K 7/20272* (2013.01)

(58) Field of Classification Search
None
See application file for complete search history.

(56) References Cited

U.S. PATENT DOCUMENTS

| | | | | |
|---|---|---|---|---|
| 3,609,206 | A * | 9/1971 | McConnell | ......... F28D 15/0266 |
| | | | | 62/401 |
| 7,219,714 | B1 * | 5/2007 | Heydari | ................ H01L 23/473 |
| | | | | 257/E23.098 |
| 2012/0061057 | A1 | 3/2012 | Okano et al. | |
| 2012/0263940 | A1 * | 10/2012 | Arzberger | ................ H01B 1/04 |
| | | | | 977/734 |

* cited by examiner

*Primary Examiner* — Stephen W Jackson
(74) *Attorney, Agent, or Firm* — Keating & Bennett, LLP

(57) ABSTRACT

A cooling apparatus includes a cold plate made of a metal, a casing, a pump, a ground wire, and a conductive component. The pump includes a motor to drive an impeller, and a circuit board to control the motor. The circuit board is connected to the ground wire. The conductive component electrically connects the cold plate to the ground wire.

5 Claims, 3 Drawing Sheets

COOLING APPARATUS AND COOLING SYSTEM

CROSS-REFERENCE TO RELATED APPLICATIONS

The present application claims priority under 35 U.S.C. § 119 to Japanese Patent Application No. 2021-112668 filed on Jul. 7, 2021, the entire contents of which are hereby incorporated herein by reference.

FIELD OF THE INVENTION

The present disclosure relates to a cooling apparatus and a cooling system.

BACKGROUND

A known cooling apparatus of a liquid-cooling type includes: a circulatory path for a coolant that cools a temperature rise portion; a heat absorbing unit that absorbs heat from the temperature rise portion by the coolant; a heat radiating unit that radiates the heat from the coolant; and a pump that circulates the coolant.

In the known cooling apparatus, the heat absorbing unit is grounded to prevent a grounded liquid-contacting metal portion from being charged by, for example, static electricity.

In the known cooling apparatus, however, it is unclear how to connect the heat absorbing unit to the ground. In mounting the cooling apparatus to an actual machine, the routing of a ground lead becomes problematic.

SUMMARY

A cooling apparatus according to an example embodiment of the present disclosure includes a cold plate made of a metal and being in contact with a heat generating component, a casing including an internal space defined therein and including a flow path along which a refrigerant flows, the flow path being located in the internal space, a conductive component, and a connection connecting a first end of the conductive component to the cold plate. The conductive component includes a second end connected to a ground.

A cooling system according to an example embodiment of the present disclosure includes the foregoing cooling apparatus, a heat radiation assembly, and a flow path pipe through which a refrigerant flows, the flow path pipe connecting the cooling apparatus and the heat radiation assembly. The heat radiation assembly is electrically connected to the ground.

The above and other elements, features, steps, characteristics and advantages of the present disclosure will become more apparent from the following detailed description of the example embodiments with reference to the attached drawings.

DETAILED DESCRIPTION

In the following description, a first direction X, a second direction Y, and a third direction Z that are orthogonal to each other are described as appropriate for ease of understanding. In addition, a first side in the first direction X is described as a first side X1 in the first direction X, and a second side in the first direction X is described as a second side X2 in the first direction X. A first side in the second direction Y is described as a first side Y1 in the second direction Y, and a second side in the second direction Y is described as a second side Y2 in the second direction Y. A first side in the third direction Z is described as a first side Z1 in the third direction Z, and a second side in the third direction Z is described as a second side Z2 in the third direction Z. The following description will be given with the first direction X defined as an up-down direction in some cases for convenience. The first side X1 in the first direction X corresponds to the lower side, and the second side X2 in the first direction X corresponds to the upper side. It should be noted that the up-down direction, the upper side, and the lower side are merely defined for convenience of description; therefore, the up-down direction does not necessarily refer to a vertical direction. In addition, the up-down direction is defined only for the convenience of description and is not therefore intended to limit an orientation of a cooling apparatus according to an example embodiment of the present disclosure during use.

Figure 1:
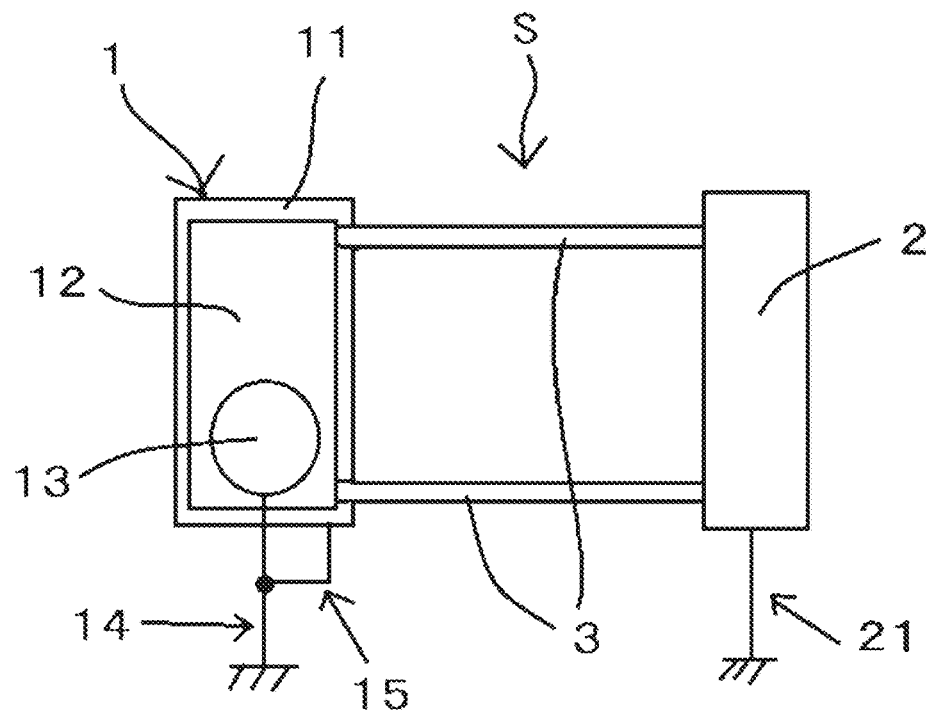
FIG. 1 is a schematic diagram of a cooling system according to an example embodiment of the present disclosure.

FIG. 1 is a schematic diagram of a cooling system S according to an example embodiment of the present disclosure. The cooling system S includes a cooling apparatus 1, a heat radiation assembly 2, and a flow path pipe 3. The cooling system S is filled with a refrigerant. The refrigerant circulates between the cooling apparatus 1 and the heat radiation assembly 2 through the flow path pipe 3. The cooling apparatus 1 is in contact with a heat generating component. The cooling apparatus 1 receives heat from the heat generating component and exchanges the heat with the refrigerant. The heat from the cooling apparatus 1 is transferred to the heat radiation assembly 2 through the flow path pipe 3. When the refrigerant flows through the heat radiation assembly 2, the heat from the cooling apparatus 1 is radiated outside. Examples of the heat generating component may include, but not limited to, a microprocessor, a semiconductor device such as a power device, and a light source such as a projector. The cooling apparatus 1 is suitable for cooling such a heat generating component.

The cooling apparatus 1 includes a cold plate 11, a casing 12, a pump 13, and a conductive component 15. The pump 13 is connected to a ground 14. The conductive component 15 connects the cold plate 11 to the ground 14. The conductive component 15 is connected to the cold plate 11 with a connection to be described later. Since the cold plate 11 is connected to the ground 14 with the conductive component 15, an electric charge on the cold plate 11 is sent to the ground 14. The ground 14 may be grounded. The ground 14 may alternatively be connected to a ground of a power supply circuit (not illustrated) mounted on an actual machine such as a server.

Figure 2:
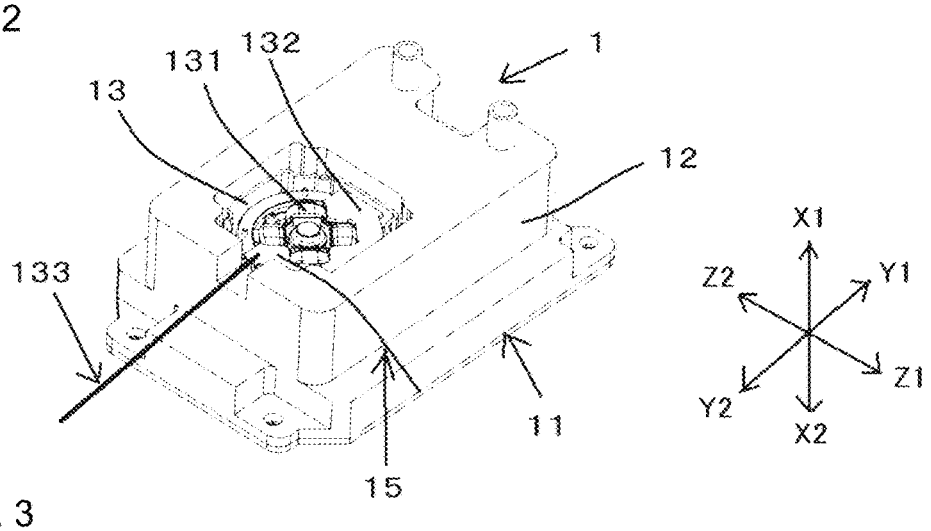
FIG. 2 is a perspective view of a cooling apparatus according to an exemplary first example embodiment of the present disclosure.

FIG. 2 is a perspective view of the cooling apparatus 1 according to a first example embodiment of the present disclosure. The cooling apparatus 1 includes the cold plate 11, the casing 12, the pump 13, and the conductive component 15. In the cooling apparatus 1 according to the first example embodiment, the cold plate 11, the casing 12, and the pump 13 are arranged in this order from the second side X2 in the first direction X toward the first side X1 in the first direction X.

The casing 12 has an internal space defined therein. The internal space in the casing 12 defines a flow path along which the refrigerant flows, in conjunction with a flow path portion 111 (to be described later) of the cold plate 11. Heat from a surface of the cold plate 11 on the second side X2 in the first direction X is transferred to the refrigerant flowing along the flow path portion 111 provided on a surface of the cold plate 11 on the first side X1 in the first direction X.

The pump 13 includes a motor 131, a circuit board 132, and a ground wire 133. The motor 131 rotates an impeller (not illustrated) accommodated in the casing 12. The circuit board 132 has a plurality of electronic components (not illustrated) mounted thereon for controlling the motor 131. The rotation of the impeller causes the refrigerant to circulate in the cooling system S. The circuit board 132 is connected to the ground wire 133, and each electronic component is electrically connected to the motor 131.

The conductive component 15 of the cooling apparatus 1 electrically connects the cold plate 11 to the ground wire 133. The conductive component 15 is, for example, a lead wire. In addition to the lead wire, the conductive component 15 may alternatively be any conductive member such as a conductive plate-shaped component or a conductive tape.

Figure 3:
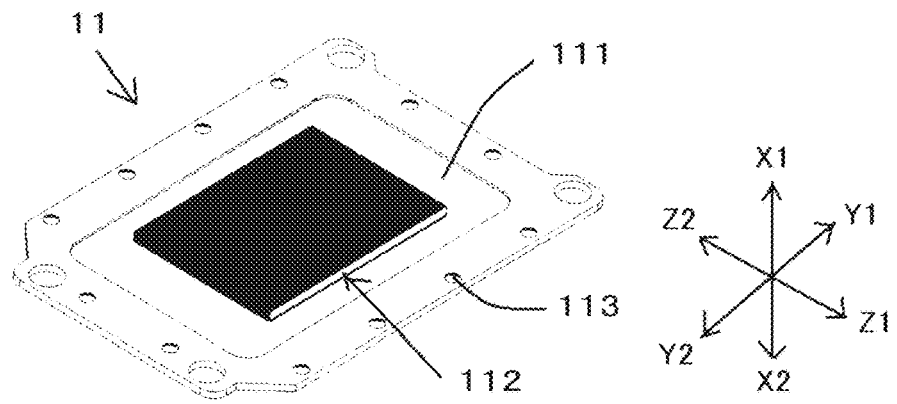
FIG. 3 is a perspective view of a cold plate 11 according to the first example embodiment of the present disclosure.

FIG. 3 is a perspective view of the cold plate 11 according to the first example embodiment of the present disclosure. The cold plate 11 is a plate-shaped metal component. Examples of a material for the cold plate 11 may include, but not limited to, copper and aluminum each having high thermal conductivity. The surface of the cold plate 11 on the second side X2 in the first direction X is in contact with the heat generating component (not illustrated). The cold plate 11 may be in direct contact with the heat generating component or may be in indirect contact with the heat generating component with a member having high thermal conductivity interposed between the cold plate 11 and the heat generating component.

The cold plate 11 includes the flow path portion 111 along which the refrigerant flows. The flow path portion 111 is provided on the surface of the cold plate 11 on the first side X1 in the first direction X. The cold plate 11 also includes a plurality of fins 112 extending toward the first side X1 in the first direction X. The fins 112 are provided on the flow path portion 111. The fins 112 are identical in member to the cold plate 11. Specifically, the fins 112 are formed by skiving. The fins 112 increase a contact area with the refrigerant and thereby improve heat exchange efficiency.

When the refrigerant circulates through the cooling system S, the constituent components of the cooling system S come into contact with the refrigerant, resulting in charge transfer. The cold plate 11 is electrically charged by this charge transfer. The cold plate 11 thus electrically charged is likely to cause deposition of impurities in the cooling system S. The impurities are particularly deposited on a slight clearance between adjacent two of the fins 112 to reduce heat exchange efficiency, which may exert an adverse influence on the heat generating component cooling performance of the cooling apparatus 1.

Since the conductive component 15 brings the cold plate 11 and the ground wire 133 into electrical conduction, the electric charge on the cold plate 11 is sent to the ground wire 133 via the conductive component 15. This configuration thus enables a reduction in amount of electric charge on the cold plate 11 and a reduction in amount of impurities to be deposited in the cooling system S. This configuration therefore prevents reduction in heat exchange efficiency and keeps the heat generating component cooling performance longer.

As illustrated in FIG. 2, the conductive component 15 has a first end connected to the cold plate 11. The conductive component 15 has a second end connected to the circuit board 132. The conductive component 15 is connected to the circuit board 132 while being routed along an outer peripheral face of the casing 12.

Figure 4:
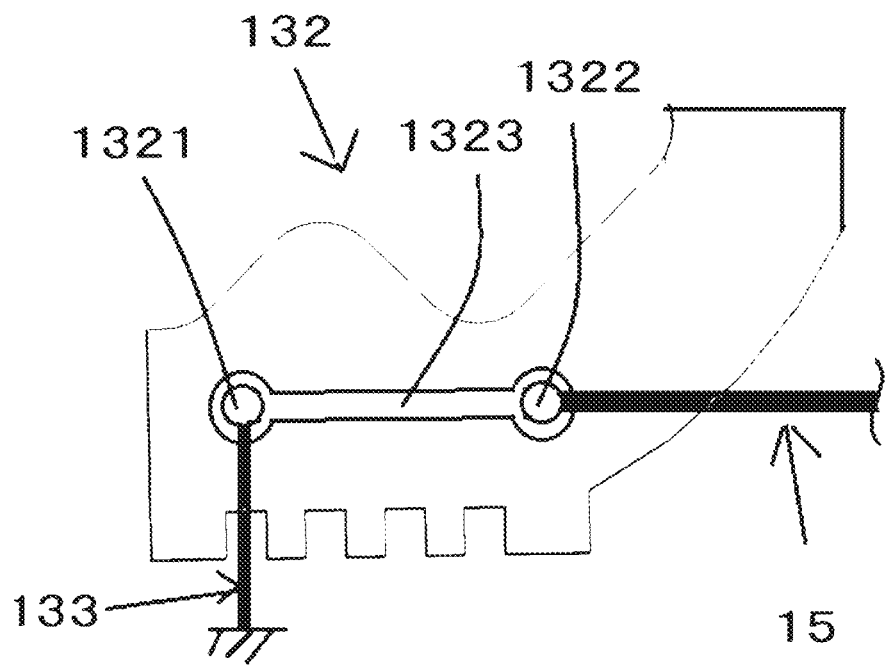
FIG. 4 is a plan view of a circuit board 132 according to the first example embodiment of the present disclosure.

FIG. 4 is a plan view of the circuit board 132 according to the first example embodiment of the present disclosure. The circuit board 132 includes a first connection portion 1321, a second connection portion 1322, and a wiring portion 1323. The first connection portion 1321 is connected to the ground wire 133. The second connection portion 1322 is connected to the conductive component 15. The wiring portion 1323 connects the first connection portion 1321 and the second connection portion 1322. Each of the first connection portion 1321 and the second connection portion 1322 is, for example, a land. The first connection portion 1321 and the second connection portion 1322 are respectively connected to the ground wire 133 and the conductive component 15 by, for example, soldering. In addition to the connection by soldering, the first connection portion 1321 and the second connection portion 1322, each of which is, for example, a connector component, may be respectively connected to the ground wire 133 and the conductive component 15. The wiring portion 1323 is, for example, a copper circuit pattern.

FIG. 2 illustrates the bared circuit board 132 for convenience; however, the circuit board 132 is embedded with a resin in practice. Examples of the resin may include, but not limited to, potting resins such as a urethane resin and an epoxy resin. Since the circuit board 132 is embedded with the resin, the electronic components, the joint between the ground wire 133 and the circuit board 132, and the joint between the conductive component 15 and the circuit board 132 are also embedded with the resin. This configuration thus improves resistance to water.

The conductive component 15 is connected to the ground wire 133 with the circuit board 132 of the pump 13 interposed between the conductive component 15 and the ground wire 133. This configuration thus eliminates a necessity of another ground wire different from the ground wire for the motor 131 of the pump 13. In particular, since the conductive component 15 is intensively used for the cooling apparatus 1, the conductive component 15 is less likely to become a hindrance in mounting the cooling apparatus 1 to an actual machine.

Figure 5:
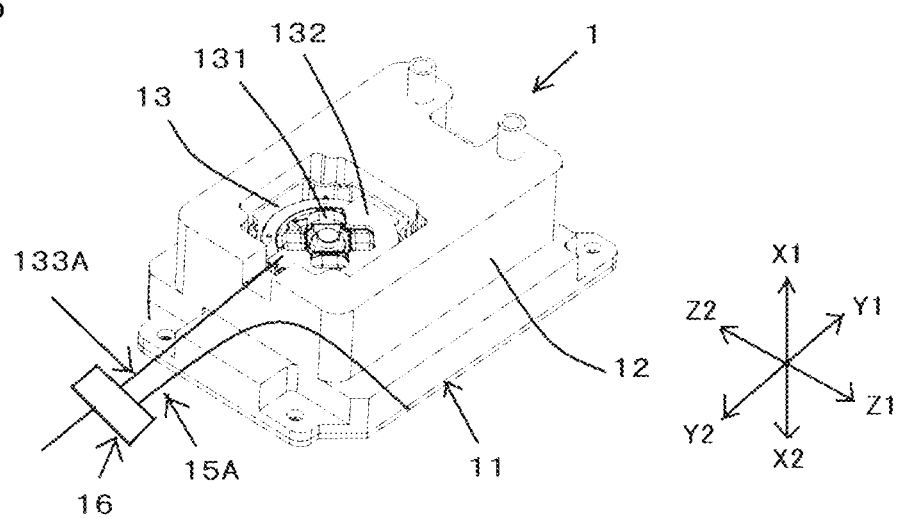
FIG. 5 is a perspective view of a cooling apparatus 1 according to a second example embodiment of the present disclosure.

FIG. 5 is a perspective view of a cooling apparatus 1 according to a second example embodiment of the present disclosure. The second example embodiment is similar in structures and advantageous effects to the first example embodiment except a method of connecting a conductive component 15A to a ground wire 133A.

In the second example embodiment, a conductive component 15A is connected to a portion of a ground wire 133A between two ends of the ground wire 133A. Specifically, a connector 16 is connected to a portion of the ground wire 133A between the two ends of the ground wire 133A, and the conductive component 15A is connected to the connector 16. The connector 16 thus brings the conductive component 15A and the ground wire 133A into electrical conduction. The connector 16 is, for example, a branch connector.

According to the second example embodiment, the conductive component 15A is electrically connectable to the ground wire 133A even in a case where the conductive component 15A cannot be connected to a circuit board 132 due to, for example, a small mounting area of the circuit board 132.

Figure 6:
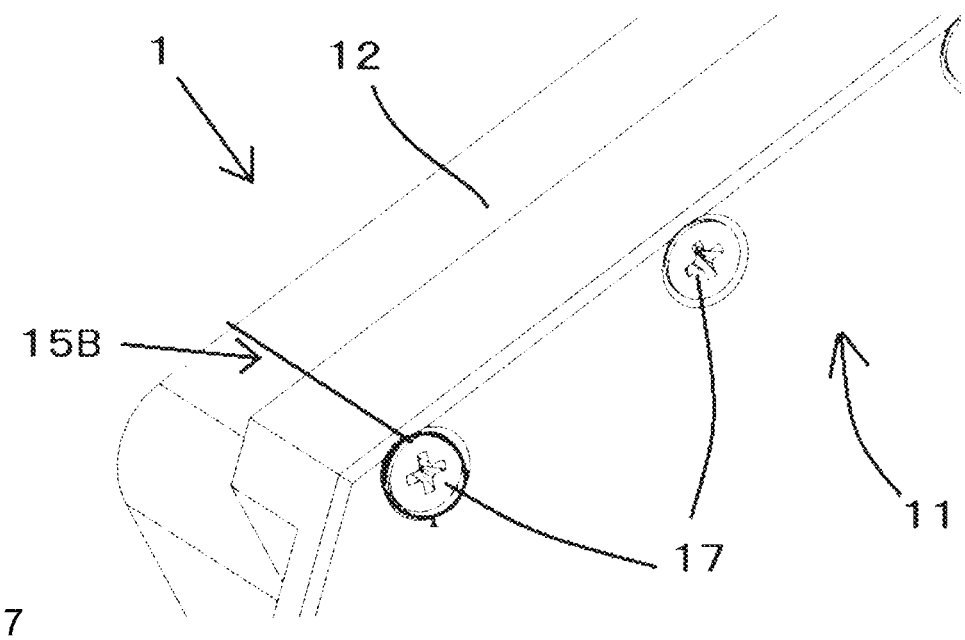
FIG. 6 is an enlarged perspective view of a cooling apparatus 1 according to a third example embodiment of the present disclosure as seen from a cold plate 11.

FIG. 6 is an enlarged perspective view of a cooling apparatus 1 according to a third example embodiment of the present disclosure as seen from a cold plate 11. The third example embodiment is similar in structures and advantageous effects to the foregoing example embodiments except a method of connecting a conductive component 15B.

The cooling apparatus 1 according to the third example embodiment includes a cold plate 11, a casing 12, and a fastening component 17. The cold plate 11 is fastened to the casing 12 with the fastening component 17. The fastening component 17 is, for example, a screw. For example, the cold plate 11 is fastened to the casing 12 with the fastening component 17 through a hole 113 (see FIG. 3) in the cold plate 11.

A conductive component 15B has a first end connected to the cold plate 11 and the fastening component 17. Specifically, the first end of the conductive component 15B is sandwiched and fixed between the cold plate 11 and the fastening component 17. The conductive component 15B is, for example, a lead wire having a first end to which a ring-shaped round terminal is attached. The conductive component 15B is fixed at the round terminal sandwiched between the cold plate 11 and a head portion of the fastening component 17 which is a screw. The conductive component 15B is thus electrically connected to the cold plate 11.

This configuration allows the conductive component 15B to be connected and fixed to the cold plate 11 which is a plate-shaped component. The fastening component 17 is used for fastening the cold plate 11 and the casing 12 together. This configuration therefore enables the connection between the conductive component 15B and the cold plate 11 without an additional component.

The conductive component 15B has a second end that is preferably connected to a ground wire 133 by the method described in each of the foregoing example embodiments. However, the third example embodiment may produce similar advantageous effects to those of the foregoing example embodiments as long as the second end of the conductive component 15B is connected to another portion serving as a ground.

Figure 7:
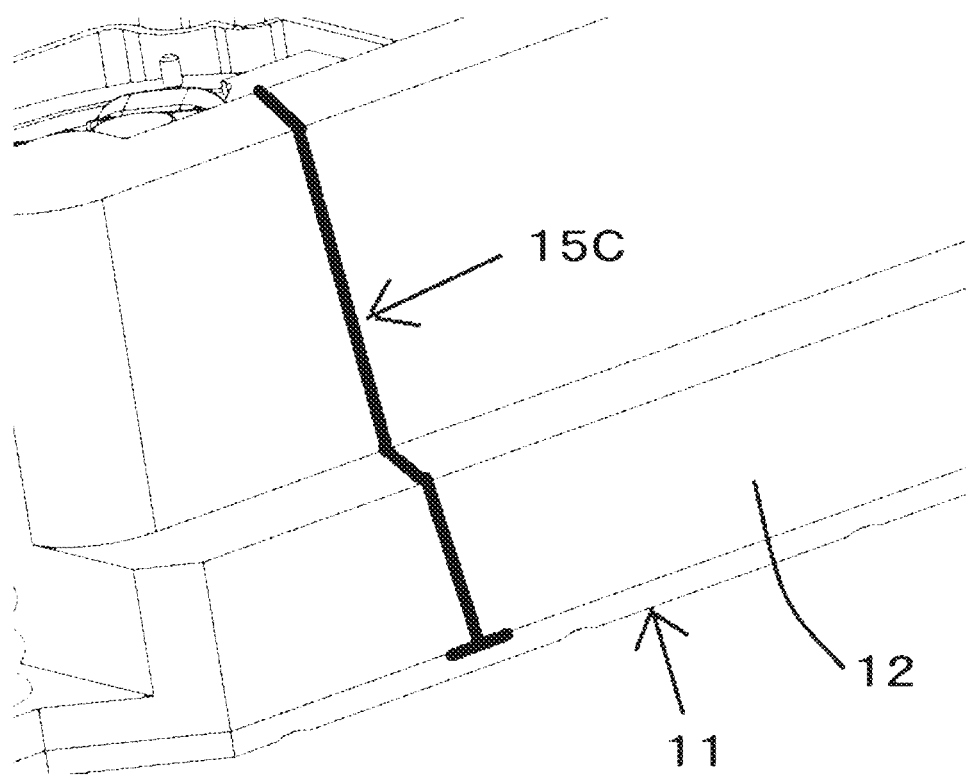
FIG. 7 is an enlarged perspective view of a cooling apparatus 1 according to a fourth example embodiment of the present disclosure.

FIG. 7 is an enlarged perspective view of a cooling apparatus 1 according to an exemplary fourth example embodiment of the present disclosure. The fourth example embodiment is similar in structures and advantageous effects to the foregoing example embodiments except a method of connecting a conductive component 15C.

The cooling apparatus 1 is similar to the cooling apparatus 1 according to the third example embodiment and includes a cold plate 11 and a casing 12 that are fastened with a fastening component 17. The conductive component 15C has a first end located at a clearance between the cold plate 11 and the casing 12. Since the cold plate 11 and the casing 12 are fastened with the fastening component 17, the first end of the conductive component 15C is sandwiched between the cold plate 11 and the casing 12. The first end of the conductive component 15C comes into contact with the cold plate 11 to establish an electrical connection between the conductive component 15C and the cold plate 11.

This configuration allows the conductive component 15C to be connected and fixed to the cold plate 11 which is a plate-shaped component. This configuration also enables the connection between the conductive component 15C and the cold plate 11 without an additional component.

The conductive component 15C has a second end that is preferably connected to a ground wire 133 by the method described in each of the foregoing example embodiments. However, the fourth example embodiment may produce similar advantageous effects to those of the foregoing example embodiments as long as the second end of the conductive component 15C is connected to another portion serving as a ground.

In the cooling system S illustrated in FIG. 1, the heat radiation assembly 2 is, for example, a radiator. The heat radiation assembly 2 is made of a metal having high thermal conductivity, such as copper or aluminum. The heat radiation assembly 2, through which the refrigerant flows, is also electrically charged. However, the electric charge on the heat radiation assembly 2 is dissipated to a ground 21 (see FIG. 1) to which the heat radiation assembly 2 is connected.

The example embodiments (including their modifications) of the present disclosure have been described above with reference to the drawings. It should be noted that the present disclosure is not limited to the foregoing example embodiments and is implementable in various forms within a range not departing from the scope of the present disclosure. In addition, various disclosure are conceivable by an appropriate combination of the constituent elements described in the foregoing example embodiments. For example, some constituent elements may be eliminated from all the constituent elements described in the foregoing example embodiments. For example, constituent elements described in different example embodiments may be appropriately combined. In the drawings, the respective constituent elements are schematically illustrated for ease of understanding. With regard to each of the illustrated constituent elements, the thickness, length, number, interval, and the like are different from actual ones on a case-by-case basis for convenience of the creation of the drawings. With regard to each of the constituent elements described in the foregoing example embodiments, the material, shape, dimension, and the like are illustrative and not restrictive, and are therefore changeable within a range not substantially departing from the advantageous effects of the present disclosure.

The present disclosure is applicable to, for example, a cooling apparatus.

Features of the above-described example embodiments and the modifications thereof may be combined appropriately as long as no conflict arises.

While example embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

What is claimed is:
1. A cooling apparatus comprising:
    a cold plate made of a metal and in contact with a heat generating component;
    a casing including an internal space defined therein and including a flow path along which a refrigerant flows, the flow path being located in the internal space;

a conductive component; and a connection connecting a first end of the conductive component to the cold plate; wherein the conductive component includes a second end connected to a ground;

the connection includes a fastening component with which the cold plate and the casing are fastened together; and the fastening component includes an end which is spaced away from the cold plate in a direction in which the cold plate and the casing oppose one another.

2. The cooling apparatus according to claim 1, further comprising:

a pump including:

a motor to rotate an impeller;

a circuit board including an electronic component to control the motor; and a ground wire including a first end connected to the circuit board and a second end connected to the ground; wherein the conductive component is connected to the circuit board and is electrically connected to the ground wire with the circuit board interposed between the conductive component and the ground wire.

3. The cooling apparatus according to claim 2, wherein the circuit board includes:

a first connection portion connected to the ground wire;

a second connection portion connected to the conductive component; and a wiring portion connecting the first connection portion and the second connection portion.

4. The cooling apparatus according to claim 1, further comprising:

a pump including:

a motor to rotate an impeller;

a circuit board including an electronic component to control the motor; and a ground wire including a first end connected to the circuit board and a second end connected to the ground; wherein the conductive component is connected to the ground wire.

5. The cooling apparatus according to claim 1, wherein the connection includes the casing; and the first end of the conductive component is sandwiched and fixed between the casing and the cold plate.

\* \* \* \* \*